(12) United States Patent
Takita (10) Patent No.: US 6,175,272 B1
(45) Date of Patent: Jan. 16, 2001

(54) PULSE—WIDTH MODULATION SYSTEM (75) Inventor: Mark K. Takita, Palo Alto, CA (US)

(73) Assignee: Nikon Corporation, Tokyo (JP)

( * ) Notice: Under 35 U.S.C. 154(b), the term of this patent shall be extended for 0 days.

(21) Appl. No.: 08/994,102

(22) Filed: Dec. 19, 1997

(51) Int. Cl.[7] .................................................. H03F 3/38
(52) U.S. Cl. ................................................ 330/10; 330/251
(58) Field of Search ........................ 330/10, 251, 207 A, 330/297, 146

(56) References Cited

U.S. PATENT DOCUMENTS

| | | | |
|---|---|---|---|
| 3,787,730 | 1/1974 | Ray et al. ............................... | 307/77 |
| 4,325,111 | 4/1982 | Quiogue ................................. | 363/17 |
| 4,355,277 | 10/1982 | Davis et al. ........................... | 323/351 |
| 4,554,512 * | 11/1985 | Aiello ..................................... | 330/10 |
| 4,581,565 | 4/1986 | Van Pelt et al. ..................... | 318/294 |
| 4,683,439 * | 7/1987 | Atherton et al. ...................... | 330/10 |
| 4,841,165 | 6/1989 | Bowles ................................... | 307/132 |
| 4,851,753 | 7/1989 | Hamilton .............................. | 318/609 |
| 4,873,618 | 10/1989 | Fredrick et al. ...................... | 363/17 |
| 4,914,399 * | 4/1990 | Doany ................................... | 330/10 |
| 5,014,016 * | 5/1991 | Anderson ............................. | 330/251 |
| 5,075,634 | 12/1991 | French ................................. | 330/146 |
| 5,077,539 * | 12/1991 | Howatt .................................. | 330/10 |
| 5,144,211 | 9/1992 | Daggett et al. ................. | 318/568.11 |
| 5,396,165 | 3/1995 | Hwang et al. ....................... | 323/210 |
| 5,398,003 * | 3/1995 | Heyl et al. ............................ | 330/251 |
| 5,442,317 * | 8/1995 | Stengel ................................. | 330/10 |
| 5,552,683 | 9/1996 | Dargent ................................ | 318/287 |
| 5,596,446 | 1/1997 | Plesko ................................... | 359/214 |
| 5,617,058 * | 4/1997 | Adrian et al. ........................ | 330/10 |
| 5,805,020 * | 9/1998 | Danz et al. ........................... | 330/251 |

* cited by examiner

Primary Examiner—Benny Lee
Assistant Examiner—Khanh Van Nguyen
(74) Attorney, Agent, or Firm—Skjerven Morrill MacPherson LLP (57) ABSTRACT

A high-power PWM system with improved low-power performance and which includes an oscillator configured to provide a substantially periodic signal to a pulse-width modulator. The pulse-width modulator outputs a PWM signal, derived from the analog signal and the periodic signal, on the PWM output node to a high-power amplifier that can select from a number of power-supply voltages. The PWM system improves amplification accuracy at low input signal levels by selecting a reduced power-supply voltage. The pulse width of the PWM signal is increased proportional to the decrease in the power-supply voltage to maintain the gain factor of the system at low power.

25 Claims, 7 Drawing Sheets

PULSE—WIDTH MODULATION SYSTEM

BACKGROUND

1. Field of the Invention

This invention relates to pulse-width modulation (PWM) systems in general, and in particular this invention relates to PWM amplifiers and linear amplifiers using PWM power supplies.

2. Description of Related Art

Figure 1:
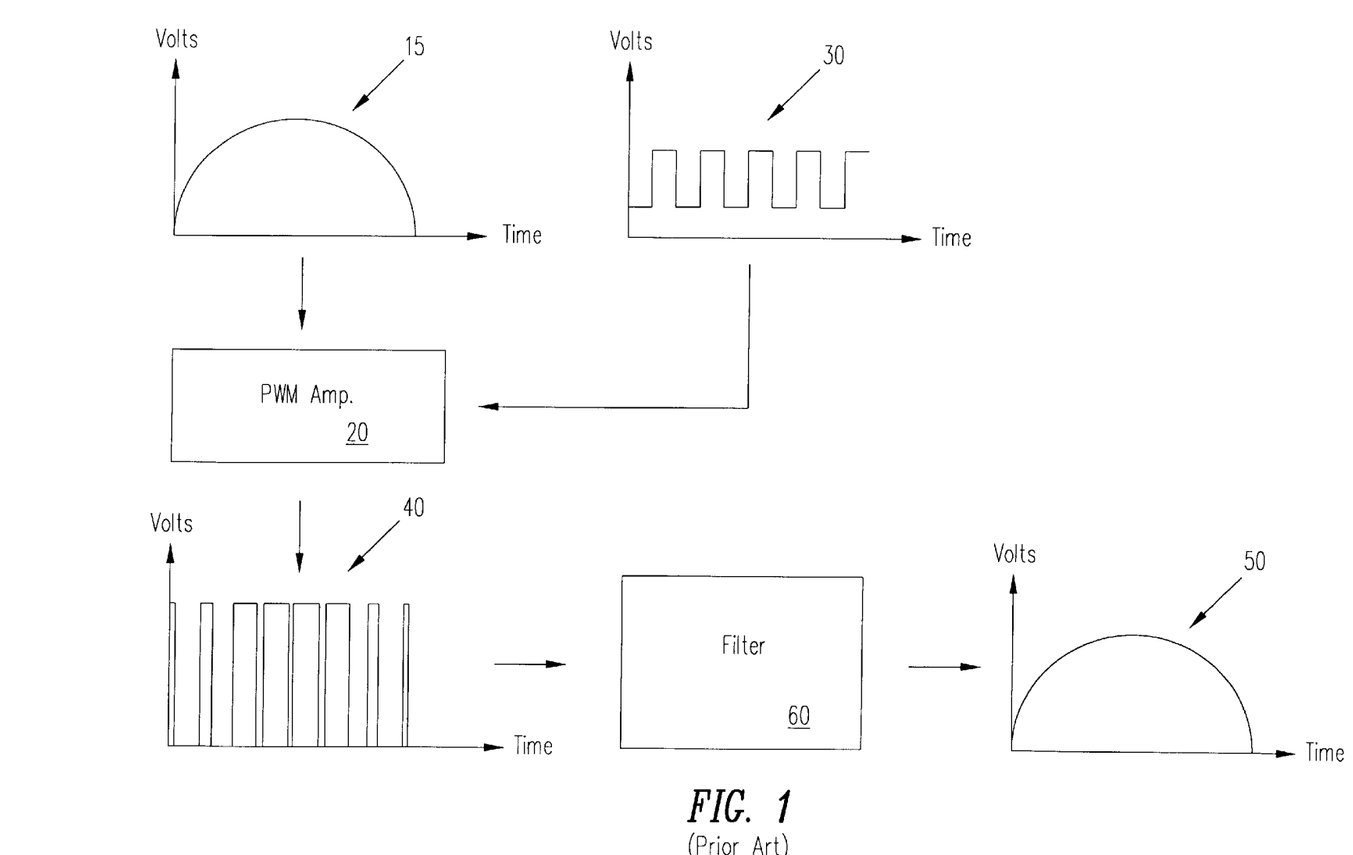
FIG. 1 illustrates the concept of pulse-width modulation (PWM) using a diagram of a conventional pulse-width modulation (PWM) amplifier system 10.

FIG. 1 illustrates the concept of pulse-width modulation (PWM) using a functional diagram of a conventional PWM amplifier system 10. An analog waveform 15, a sine wave for example, is provided to an input of a PWM amplifier 20. A second input of PWM amplifier 20 receives a periodic signal 30 from an oscillator.

PWM amplifier 20 combines waveform 15 and periodic signal 30 to create a PWM waveform 40 that switches between two voltage levels (e.g., zero and one hundred volts). The durations of the pulses, or positive "swings," of PWM waveform 40 are selected so that the integrated energy of PWM waveform 40 equals the energy of analog waveform 15 multiplied by a selected gain factor. The gain factor is the gain of PWM amplifier 20.

A filter 60 filters PWM waveform 40 to produce an analog waveform 50, a replication of analog waveform 15 multiplied by the gain factor. The filter function is typically accomplished using a mechanical or electrical filter, such as an electrical motor, that is too slow to respond to the square-wave modulation frequency of periodic signal 30.

PWM amplifier systems are typically noisier, less linear, more complex, and exhibit higher distortion than equivalent analog amplifier systems (e.g., conventional analog amplifiers). Despite these shortcomings, PWM amplifier systems are widely used because they offer superior efficiency. Amplifier efficiency can be approximated by multiplying the difference between the input voltage and the output voltage (i.e., Vout−Vin) by the output current Iout. The voltage difference Vout−Vin can be substantial in analog amplifier systems, especially in high-power applications. In contrast, there is virtually no difference between the input voltage and the output voltage Vout of a PWM amplifier, except during the switching interval when Vout slews between voltage levels. Faster switching speeds reduces the switching interval and therefore improves efficiency. It is not uncommon, for example, to obtain energy transfer efficiencies as high as 90% to 98% in PWM amplifier systems. In contrast, the efficiencies of comparable analog system may be 25% or lower.

High-power PWM amplifiers require that the difference between the input and output voltages (Vout−Vin) be relatively large. Unfortunately, as the voltage difference increases, so too does the difficulty of precisely controlling small-valued output signals. This is because small valued PWM output signals require on times (pulse widths) that are short relative to the total PWM period. Consequently, timing errors, non-linear switching characteristics, and other types of distortion are large relative to the pulse widths for high-power PWM amplifiers operating at low power.

Figure 2:
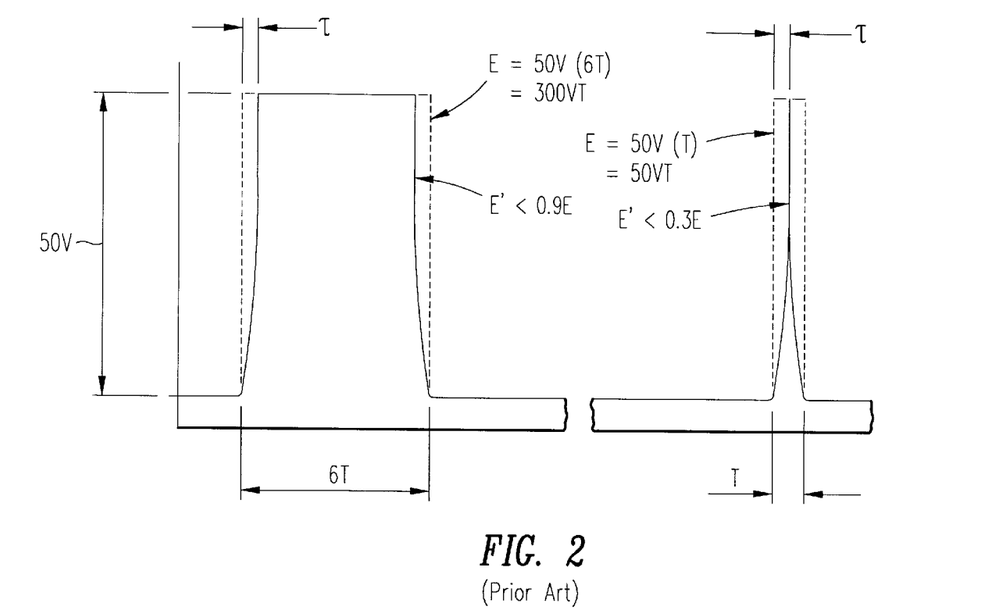
FIG. 2 illustrates the difficulty of precisely controlling small-valued output signals using high-power PWM amplifiers.

FIG. 2 illustrates the difficulty of precisely controlling small-valued output signals using high-power PWM amplifiers. FIG. 2 compares an ideal voltage waveform (dashed line) with a waveform distorted as a result of a non-ideal switching time τ. In the first example the ideal energy E is equal to the voltage swing (50V) multiplied by the pulse duration 6 T, or E=300 VT. Also in the first example, the non-ideal energy E' is somewhat less than the ideal energy E due to the switching time τ. However, the resulting error is relatively small due to the switching time τ being short relative to the pulse width.

The error is far greater in the second example, which illustrates the operation of a PWM system at lower power. Low-power output signals are created by reducing the pulse width: the switching time τ remains the same. Thus, the switching time τ is large relative to the short pulse width of the second example. The non-ideal energy E' is less than 30% of the ideal energy E. This significant reduction in accuracy at low power is further emphasized by other types of signal distortion, such as noise spikes and ringing. There is therefore a need for a high-power PWM system with improved low-power performance.

SUMMARY

The present invention is directed to a PWM system and associated method that delivers efficient high-power performance without sacrificing accuracy of the PWM waveform at low-power output levels. The system includes a pulse-width modulator configured to modulate the pulse-width of an output signal in response to an analog input signal. The pulse-width modulated signal is then amplified by a high-power amplifier.

The PWM system can be controlled to select from two (or more) switching voltages for the high-power amplifier. Relatively low switching voltages improve accuracy and power-transfer efficiency during low-power operation; higher switching voltages provide better high-power performance. Some embodiments of the PWM system maintain the gain factor during low and high-power operation by adjusting the pulse width of the PWM signal to compensate for changes in the switching voltage. For example, a doubling of the switching voltage may be offset by halving the pulse width of the PWM signal.

The claims, and not this summary, define the scope the invention.

BRIEF DESCRIPTION OF THE FIGURES

The above and other features, aspects, and advantages of the present invention will become better understood with regard to the following description, appended claims, and accompanying figures, where:

DETAILED DESCRIPTION

Figure 3A:
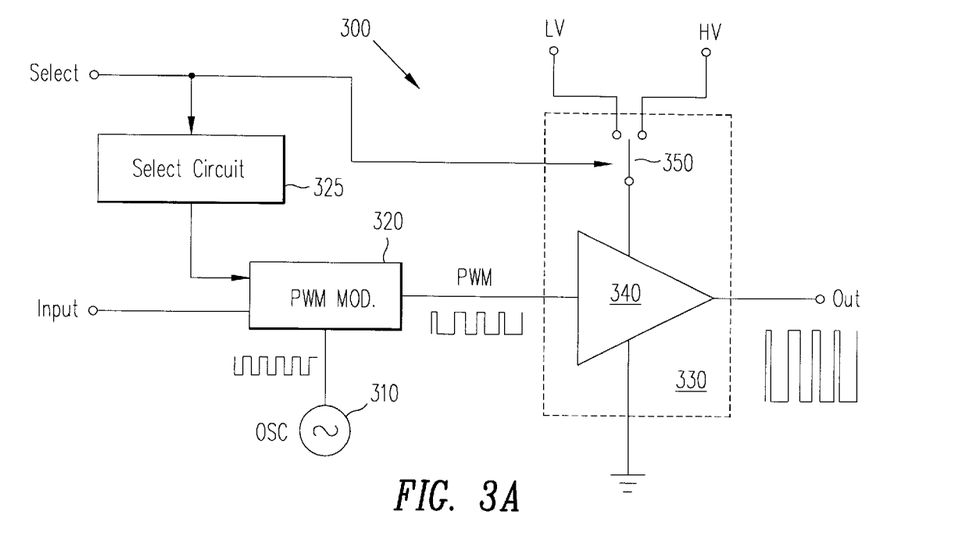
FIG. 3A is a block diagram of a PWM system 300 in accordance with the present invention.

FIG. 3A is a block diagram of a PWM system 300 in accordance with the present invention, which includes an oscillator 310 that provides a substantially periodic signal to a pulse-width modulator 320. Modulator 320 outputs a PWM signal conventionally derived from an analog input signal and the periodic signal from oscillator 310. The PWM signal is conveyed to an output stage 330.

Output stage 330, an amplifier, amplifies the PWM signal from modulator 320 to provide an amplified PWM signal to a load (not shown) via an output terminal OUT. Output stage 330 includes two constant-voltage power supply terminals connected to a pulsed amplifier 340 via a switch 350. The first power-supply terminal LV provides a voltage that is low relative to the voltage on the second power-supply terminal HV. Output stage 330 is also connected to ground potential, a third constant-voltage source. In one embodiment the voltages on terminals LV and HV are 25 and 200 volts, respectively. However, other voltage levels can be used instead of, and in addition to, those levels.

System 300 functions as a conventional PWM amplifier when either of power-supply terminals LV or HV is selected. However, system 300 is unique in that the power supply voltage and the pulse width of the PWM output signal may be adjusted to optimize system performance depending upon the level of the input signal.

System 300 adjusts the amplitude and pulse-width using an external select signal connected via a line SELECT to switch 350 and select circuit 325, which is connected to modulator 320. The select signal connects one of terminals LV and HV to amplifier 340 and causes select circuit 325 to adjust the pulse width of the PWM signal produced by modulator 320. It is understood that select circuit 325 may be located in other positions as well. By way of example, select circuit 325 may be between modulator 320 and output stage 330 or within modulator 320 itself. Using a voltage level to select from a number of terminals and to adjust the pulse width of a PWM signal is well within the skill of those in the art. By way of example, in one implementation select circuit 325 has a high clock speed which is divided by a fixed integer number determined from the voltage level of the select signal, and thereby adjusts the pulse width of the PWM signal. The effects of the select signal on the performance of system 300 are described below in connection with FIG. 3B.

Figure 3B:
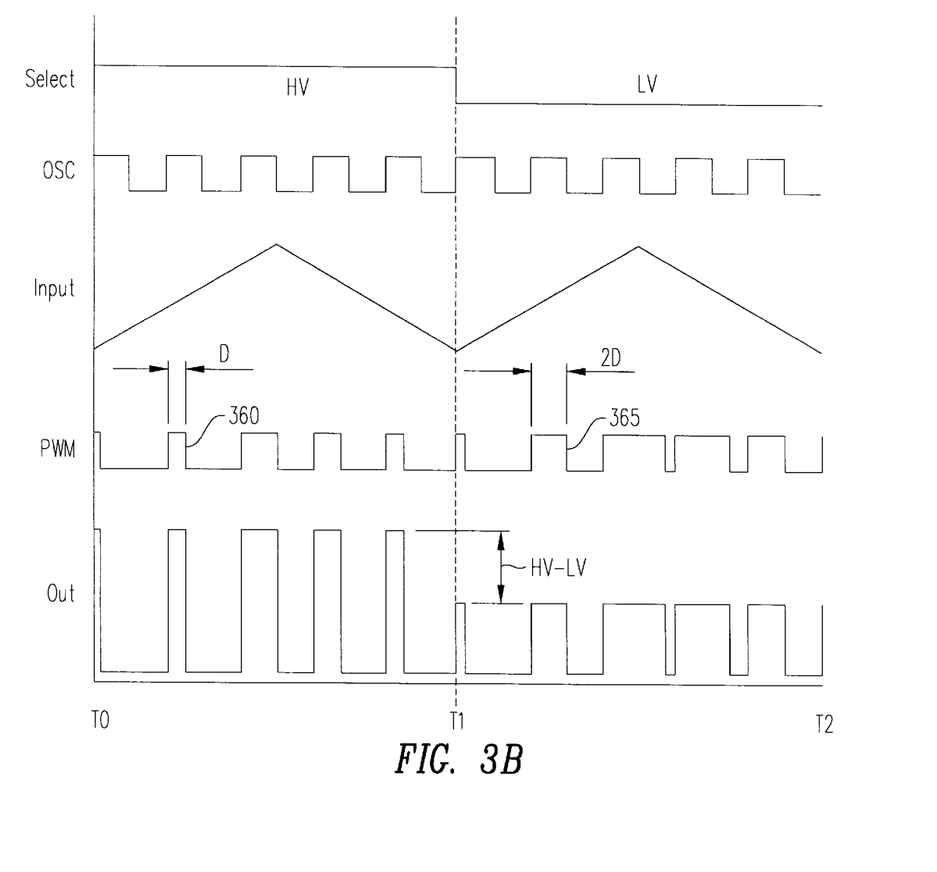
FIG. 3B illustrates the operation of system 300 by depicting theoretical waveforms associated with like-named terminals of system 300.

FIG. 3B illustrates the operation of system 300 by depicting waveforms associated with like-named terminals of system 300. A logic one (e.g., five volts) on line SELECT selects the voltage on terminal HV, while a logic zero selects the lower voltage on terminal LV. Thus, terminal HV is selected from time T0 to time T1 and terminal LV is selected from time T1 to time T2.

The gain factor G of system 300 is constant over the entire range of the analog signal on input terminal SIGNAL. That is, the energy E of the output signal on terminal OUT is equal to G times the voltage level of the input signal on terminal INPUT. In the present example, the energy of the output signal must be the same for interval T0–T1 as for interval T1–T2 because the input signal on terminal INPUT is identical for each interval.

For illustrative purposes, the voltage on terminal LV is assumed to be one-half of the voltage on terminal HV. Consequently, the voltage of the PWM output signal on output terminal OUT during interval T0–T1 is twice the voltage during interval T1–T2. The energy E of the output signal on terminal OUT is calculated by integrating the voltage on terminal OUT with respect to time. In the case of a PWM signal, the integration is simply the voltage level multiplied by the duration of the pulse or pulses. Thus, if the pulse width of the signal on terminal OUT were not altered, the energy of the output signal would be reduced by half during the interval T1–T2. This reduction is undesirable in applications that require the gain factor G remain constant regardless of the level of the input voltage.

PWM modulator 320 doubles the pulse durations of the PWM signal on line PWM during the interval T1–T2 so that the gain factor G of system 300 remains constant from time T0 to T2 despite the change in output voltage levels. Referring to FIG. 3B, for example, the pulse 360 during interval T0–T1 represents the same signal level on line PWM as does the pulse 365 during the interval T1–T2. Nevertheless, the pulse width D selected to represent the voltage level during the interval T0–T1 is one half the voltage level selected during the interval T1–T2. In fact, the pulse width of each pulse during the interval T1–T2 is double the width of the corresponding pulse of the interval T0–T1. Doubling the pulse widths when halving the output voltage level preserves the output energy provided on line OUT.

Figure 4:
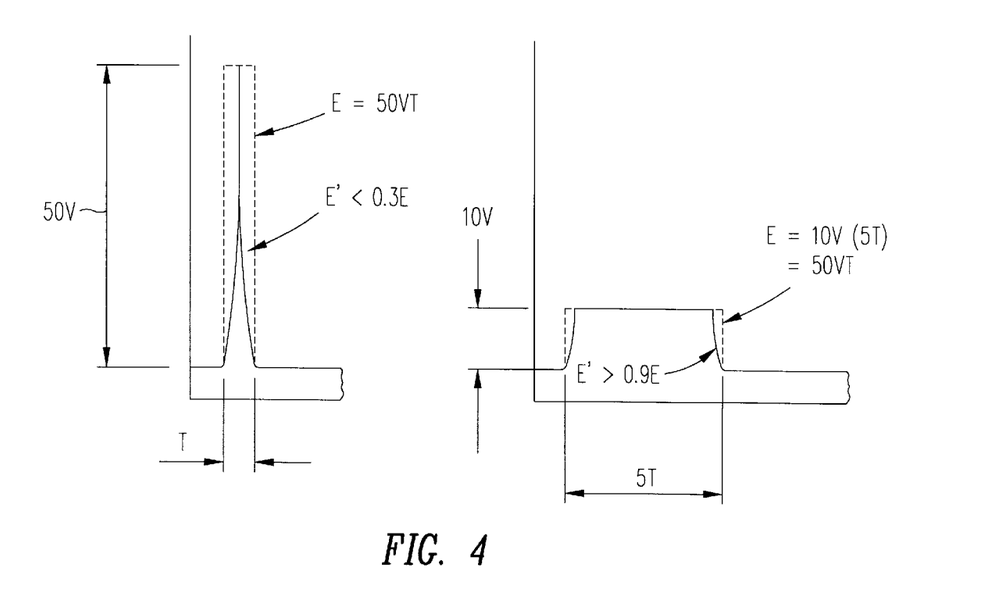
FIG. 4 illustrates the benefits of using reduced switching voltage levels to produce low-power output signals.

FIG. 4 illustrates the benefits of using reduced switching voltage levels to produce low-power output signals. FIG. 4 compares the second example of FIG. 2, in which the non-ideal energy E' was less than 30% of the ideal energy E, with a PWM output signal of reduced switching voltage. The ideal energy E for each pulse of FIG. 4 is the same; however, the actual energy is very different. In the example with the reduced amplitude the actual energy E' is a far better approximation of the ideal energy E for two reasons. First, reducing the switching voltage reduces the switching time to a time τ' that is substantially shorter than the switching time τ. Second, increasing the pulse duration (from T to 5 T) renders the pulse duration long relative to the switching time. The non-ideal energy E' of the low-voltage example is therefore a much better approximation of the ideal energy E (e.g., E'>0.9E).

While the benefits of the present invention are illustrated using the distortion associated with a finite switching time τ, the deleterious effects of other types of distortion, such as ringing, are also reduced. Consequently, PWM systems in accordance with the present invention not only improve accuracy, but also exhibit improved tolerance to timing errors, voltage fluctuations, and other instabilities.

Figure 5:
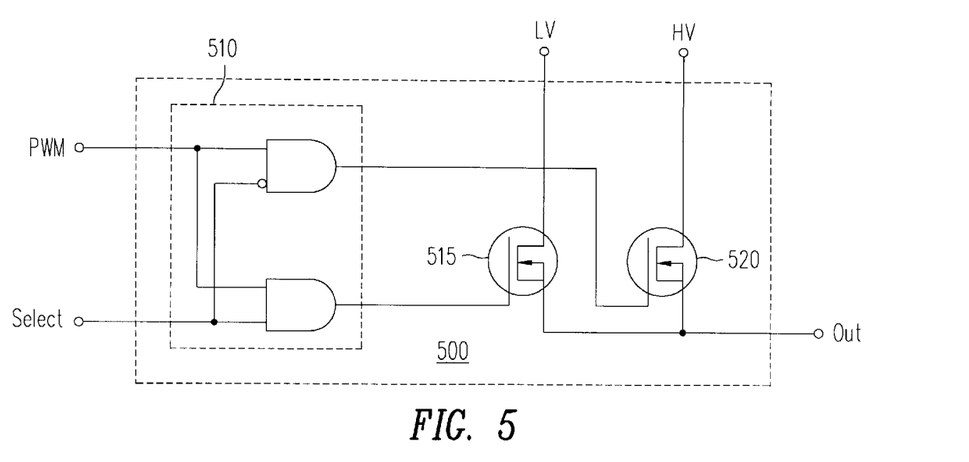
FIG. 5 is a schematic diagram of a PWM output stage 500 in accordance with the present invention to provide an amplified PWM signal on an output terminal OUT.

FIG. 5 is a schematic diagram of a PWM output stage 500 in accordance with the present invention to provide an amplified PWM signal on an output terminal OUT and corresponding to output stage 330 in FIG. 3A. Output stage 500 is an amplifier that includes select logic 510 connected to the PWM output node of a pulse-width modulator (e.g., modulator 320 of FIG. 3A) and a select terminal SELECT. Select logic 510 has a pair of terminals connected one each the respective gates of a pair of a pair of NMOS select transistors 515 and 520. Select logic 510 modulates the gate voltage of a selected one of transistors 515 and 520, the selected one depending upon the logic level on the select terminal SELECT. The particular illustrated logic gates of select logic 510 represent the functionality of select logic 510, and are not limiting. Many alternative means of accomplishing the function of select logic 510 will be readily apparent to those of skill in the art. It will be appreciated by those skilled in the art that the PWM output stage 500 of FIG. 5 may be converted to a half-bridge output stage through the addition of a transistor connecting the output terminal OUT to ground, as discussed in reference to FIG. 6B.

Figure 6A:
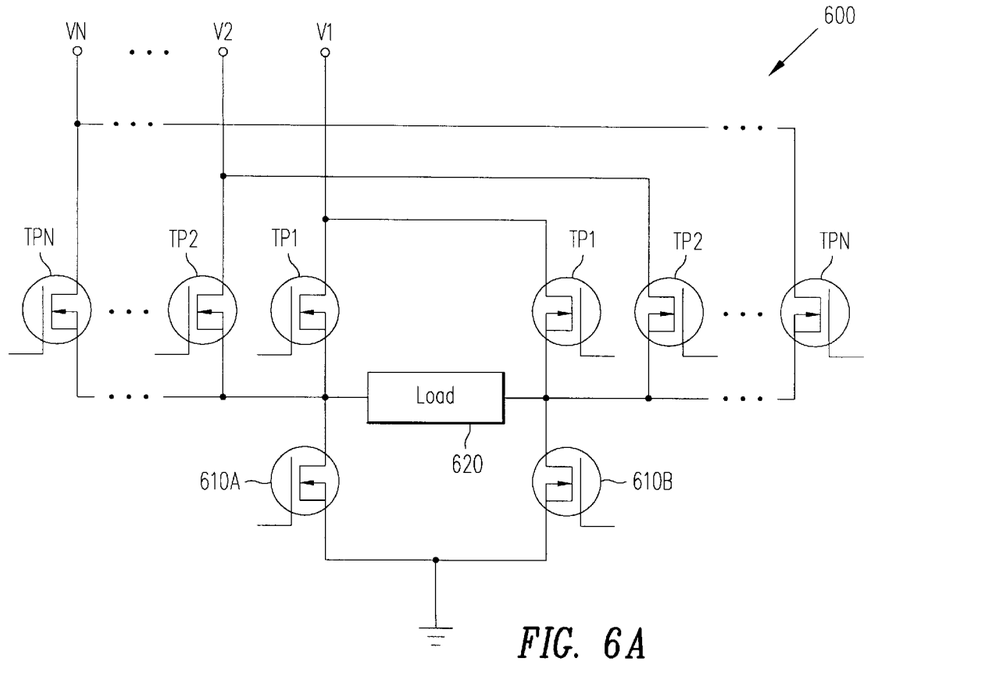
FIGS. 6A and 6B are schematic diagrams of an H-bridge output stage 600 and a half-bridge output stage 650, respectively, configured to select from between N voltage levels.

FIG. 6A is a schematic diagram of an H-bridge output stage 600 (also corresponding to output stage 330 in FIG. 3A) configured to select from between N voltage levels, as opposed to having two voltage levels as shown in output stage 500. For information relating to the workings of H-bridge amplifiers, see the copending application entitled "H-BRIDGE POWER AMPLIFIER FOR A MOTOR," by Mark K. Takita, application Ser. No. 08/994,795, filed concurrently herewith, the contents of which are incorporated herein by reference.

H-bridge 600 conventionally includes a pair of transistors 610A and 610B switchably connecting alternate terminals of a load 620 to ground potential. H-bridge 600 also includes N transistor pairs TP1 to TPN connected to N respective power-supply terminals V1 to VN. (The dashed lines indicate that there could be any number of intervening transistor pairs and corresponding power-supply voltage levels.) The gates of the transistors are connected to select logic and a PWM signal in the manner described above in connection with FIGS. 3 through 5.

Figure 6B:
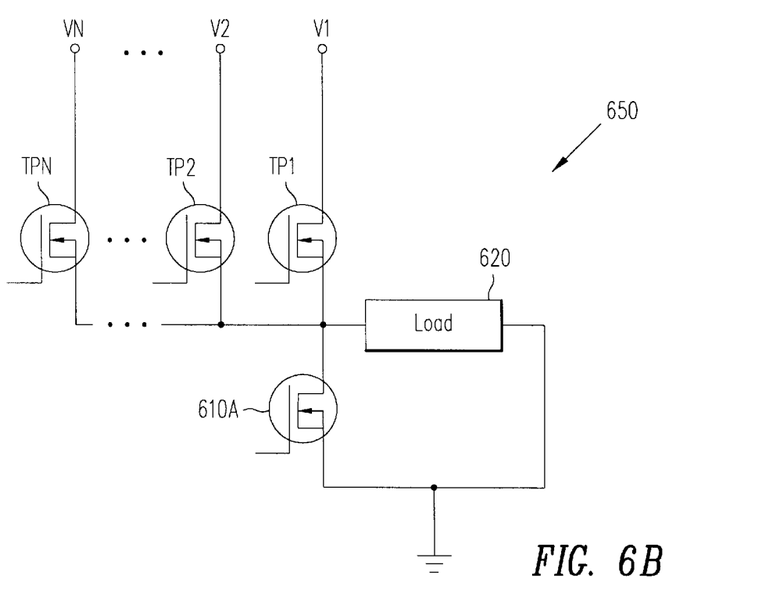

FIG. 6B is a schematic diagram of a half-bridge output stage 650 (also corresponding to output stage 330 in FIG. 3A) configured to select from between N voltage levels. Half-bridge output stage 650 is similar to H-bridge output stage 600, like elements being the same. However, the load 620 in half-bridge output stage 650 has one terminal connected directly to ground, thereby obviating the use of transistor 610B. Additionally, half-bridge output stage 650 uses only single transistors TP1 to TPN connected to one terminal of load 620 as opposed to the use of pairs connected to both terminals of load 620 in H-bridge output stage 600 shown in FIG. 6A.

Figure 7:
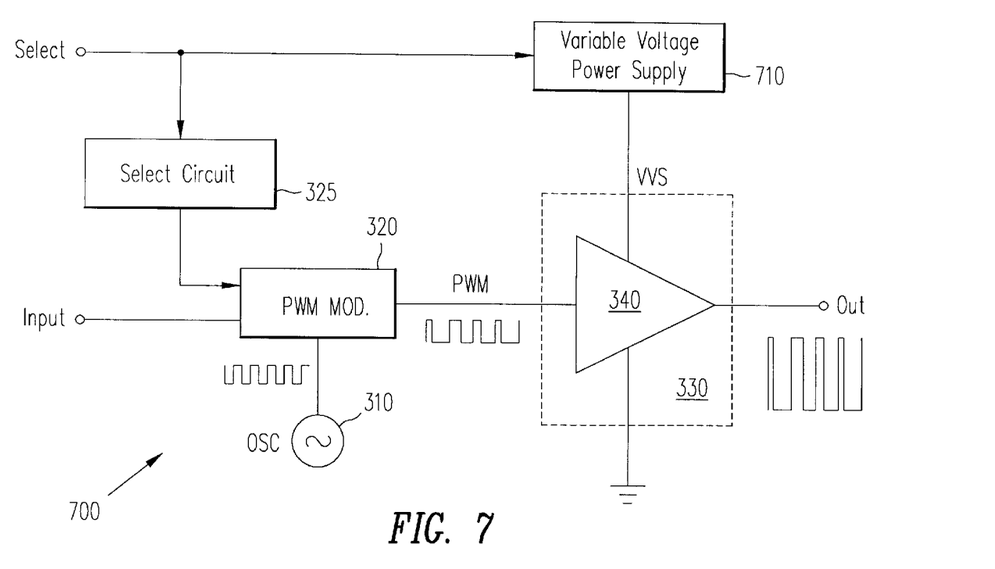
FIG. 7 is a block diagram of a PWM system 700 in accordance with an embodiment of the present invention.

FIG. 7 is a block diagram of a PWM system 700 in accordance with another embodiment of the present invention. System 700 is similar to system 300 of FIG. 3, like-numbered elements being the same. However, system 700 employs a single variable-voltage power supply 710 to provide a variable voltage on line VVS. Power supply 710 obviates the need for more than one power-supply terminal. In the embodiment of FIG. 7, the voltage level on line SELECT can be varied over a range of voltages to select from a range of power-supply voltages and corresponding degrees of pulse-width modulation. Using a voltage level to control power supply 700 and PWM modulator 320 is well within the skill of those in the art.

Figures 8A, 8B:
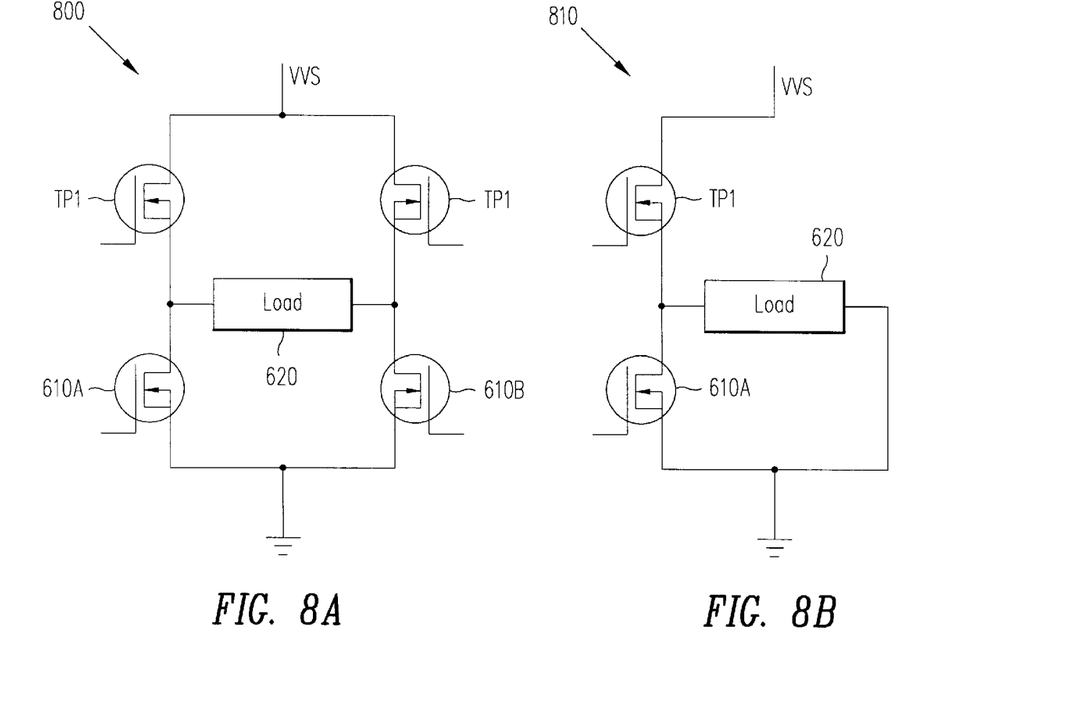
FIGS. 8A and 8B are schematic diagrams of an H-bridge output stage 800 and a half-bridge output stage 810, respectively, that employs a variable-voltage power supply.

FIG. 8A is a schematic diagram of a H-bridge output stage 800 in accordance with an embodiment of the invention, such as system 700, that employs a variable-voltage power supply. Output stage 800 is similar to output stage 600, like-numbered elements being the same. However, output stage 800 employs the variable-voltage power supply 710 of FIG. 7 to provide a variable voltage on line VVS in place of the N power supply voltages of output stage 600. Power supply 710 obviates the need for N transistor pairs. In one embodiment, power supply 710 is a high-efficiency variable power supply available from Power Ten, Inc., of Sunnyvale Calif.

FIG. 8B is a schematic diagram of a half-bridge output stage 810 in accordance with another embodiment of the present invention. Half-bridge output stage 810 is similar to H-bridge output stage 800, like elements being the same. However, similar to half-bridge output stage 650 in FIG. 6B, the load 620 in half-bridge output stage 810 has one terminal connected directly to ground, thus obviating the use of transistor 610B. Moreover, half-bridge output stage 810 uses only a single transistor TP1 as opposed to the pair used in H-bridge output stage 800 shown in FIG. 8A.

Figure 9:
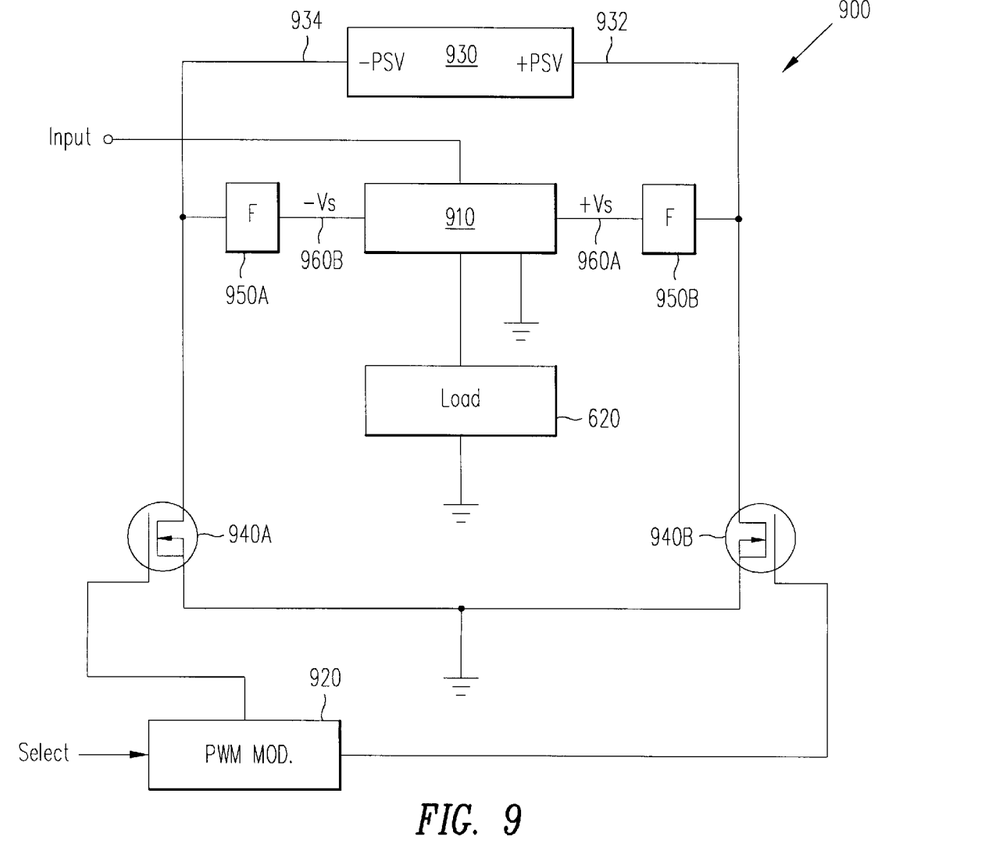
FIG. 9 is a block diagram of a PWM system 900 using a floating power supply in accordance with an embodiment of the present invention.

FIG. 9 is a block diagram of a PWM system 900 in accordance with another embodiment of the present invention. System 900 includes a dynamically referenced floating power supply that provides a variable positive voltage +Vs and a variable negative voltage −Vs to an amplifier 910, which receives an input signal via terminal INPUT. System 900 dynamically varies the voltages on lines 960A and 960B to optimize the efficiency of amplifier 910, which is a linear amplifier. It is understood that amplifier 910 may also be a PWM amplifier as described above, however, the use of a PWM amplifier in system 900 will have little effect on the efficiency of the system.

As shown in FIG. 9, PWM system 900 includes a floating voltage source 930 having a positive terminal at a voltage +PSV and a negative terminal at a voltage −PSV. The absolute sum of the voltages on the two terminals of floating voltage source 930 is a constant, equivalent to the floating power source's voltage $V_0$. The positive and negative terminals of floating voltage source 930 are connected to respective lines 932 and 934. Lines 932, 934 are switchably connected to ground potential via transistors 940A and 940B, respectively. Lines 932, 934 are also connected to conventional low pass filters 950A and 950B, which in turn are connected to amplifier 910 via lines 960A and 960B, respectively.

PWM system 900 includes a PWM modulator 920, which receives an external select signal on line SELECT and in response produces complementary PWM signals to control transistors 940A and 940B. Transistors 940A and 940B alternately connect the output terminals of floating voltage source 930 to ground potential to provide modulated voltages on lines 932 and 934. Low pass filters 950A and 950B conventionally convert the modulated voltages on lines 932 and 934 to constant voltage waveforms on lines 960A and 960B.

Amplifier 910 does not simultaneously use the variable positive voltage +Vs and the variable negative voltage −Vs despite receiving both from floating power supply 910. Amplifier 910 uses either the positive voltage referenced to ground potential or the negative voltage referenced to ground potential. For instance, if amplifier 910 is powering a motor in one direction, the positive voltage referenced to ground potential may be used, while if powering the motor in the opposite direction, the negative voltage reference to ground potential will be used. Because amplifier 910 uses only one of the variable voltages +Vs or −Vs, the variable voltage supply not used will not greatly effect the dissipated energy of the system.

The values of variable voltages +Vs and −Vs on respective lines 960A and 960B dynamically change in response to the external select signal on line SELECT. Thus, either a positive or negative variable voltage level is produced by PWM system 900, whichever is being used by amplifier 910, and that has a magnitude as close to the output voltage of amplifier 910 as possible (limited by the requirements of the driving circuitry of amplifier 910). The dissipated energy of PWM system 900 is a function of the differential voltage across amplifier 910. Thus, because PWM system 900 uses a floating power supply that produces a variable voltage level that is as close as possible to the output voltage of amplifier 910, the differential voltage across amplifier 910 is reduced and the power consumption of PWM system 900 is minimized.

Figure 10:
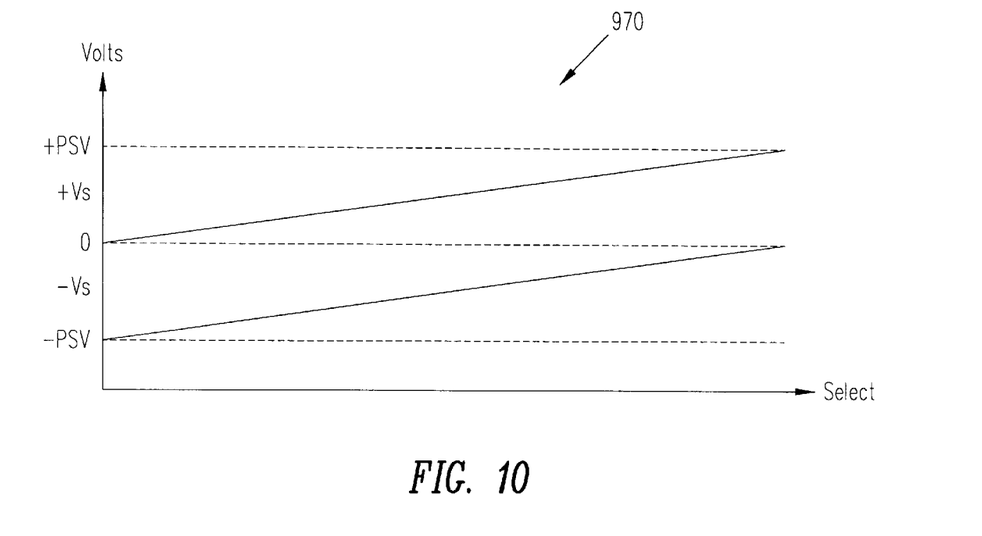
FIG. 10 is a graph 960 illustrating the performance of PWM system 900.

FIG. 10 is a graph 970 illustrating the performance of the floating power supply of PWM system 900. The y-axis of graph 970 represents voltage and the x-axis represents the voltage of the external select signal on line SELECT. As can be seen from graph 970, the variable positive voltage +Vs on line 960A can range between ground potential, represented on the x-axis by 0, and the voltage +PSV on the positive terminal of floating voltage source 930. Likewise, the variable negative voltage −Vs on line 960B can range between the voltage −PSV on the negative terminal of floating voltage source 930 and ground potential. Graph 970 also illustrates that, regardless of the value of SELECT, the difference between the variable voltages +Vs and −Vs remains constant. However, as discussed above, amplifier 910 uses only the variable positive voltage +Vs referenced to ground potential or the variable negative voltage −Vs referenced to ground potential. Consequently, the important factor illustrated in graph 970 is that the difference between the variable positive voltage +Vs and ground potential or the variable negative voltage −Vs and ground potential varies according to the value of SELECT.

Figure 11:
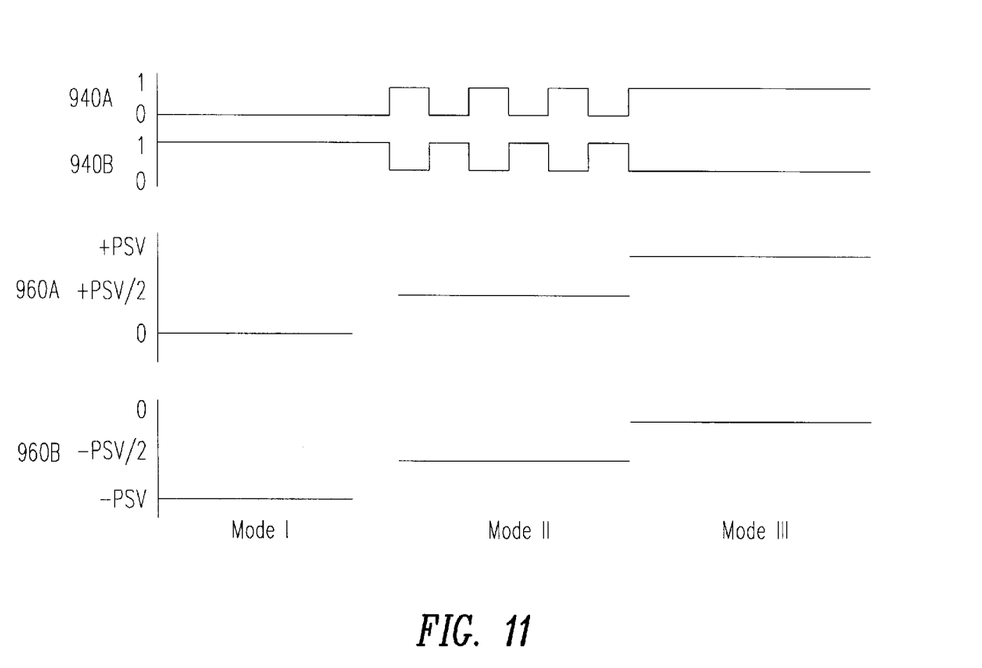
FIG. 11 illustrates the operation of PWM system 900 by depicting the waveforms associated with the like-named terminals of PWM system 900.

FIG. 11 illustrates the operation of the floating power supply of PWM system 900 by depicting the waveforms associated with the like-named elements of system 900. Three modes are illustrated in FIG. 11, where the vertical axis represents the voltage on the like named element, and the horizontal axis represents time. In mode I transistor 940A is off all the time, and transistor 940B is on all the time. Thus, in FIG. 9, line 934 is at a voltage −PSV all the time, while line 932 is connected to ground potential through transistor 940B. Consequently, in mode I line 960A is at ground potential, while line 960B is at −PSV, as illustrated in FIG. 11.

In mode II, transistors 940A and 940B have complementary 50% duty cycles. Thus, lines 932 and 934 are at voltages +PSV and ground potential, respectively, 50% of the time and at ground potential and −PSV, respectively, 50% of the time. Conventional low pass filters 950A and 950B convert the modulated voltages on lines 932 and 934 to a constant voltage of +PSV/2 and −PSV/2 on lines 960A and 960B, as illustrated in FIG. 11.

In mode III, transistor 940A is on all the time, while transistor 940B is off all the time. Consequently, as illustrated in FIG. 11 line 960A is at a voltage +PSV and line 960B is at ground potential. It is understood that by varying the duty cycle of transistors 940A and 940B any desired voltage can be generated between ground potential and +PSV on line 960A and between ground potential and −PSV on line 960B. The voltage level on line SELECT can be varied over a range of voltages to generate the degree of pulse-width modulation from modulator 920 necessary to generate the desired voltages on lines 960A and 960B. Using a voltage level to control PWM modulator 920 is well within the skill in of those in the art.

Although the present invention has been described in considerable detail with reference to certain versions thereof, other versions are possible. For example, some embodiments of the invention slew lower voltages at slower speeds to create well behaved rising and falling edges, and consequently improve linearity, during low-power operation. Also, some components are shown directly connected to one another while others are shown connected via intermediate components. In each instance the method of interconnection establishes some desired electrical communication between two or more circuit nodes. Such communication may often be accomplished using a number of circuit configurations, as will be understood by those of ordinary skill in the art. Therefore, the spirit and scope of the appended claims should not be limited to the description of the versions depicted in the figures.

What is claimed is:

1. An apparatus comprising:
   a pulse-width modulator which produces a PWM signal in response to a select signal;
   a power supply having a PWM signal input terminal which receives the PWM signal from the pulse-width modulator, and a voltage source including a first power-supply output terminal, and a second power-supply output terminal, wherein the voltage source provides a first power-supply voltage on the first power-supply output terminal, and a second power-supply voltage on the second power-supply output terminal, the first and second power supply voltages having levels determined in accordance with the PWM signal; and
   an amplifier having an input terminal which receives an input signal, a first power-supply input terminal connected to the first power-supply output terminal, a second power-supply input terminal connected to the second power-supply output terminal, and a third power-supply input terminal which provides a third constant voltage, and an output terminal which produces an output signal proportional to the difference between the third constant voltage and at least one of the first and second power-supply voltages.

2. The apparatus of claim 1, wherein
   the first power-supply output terminal is a positive output terminal and the second power-supply output terminal is a negative output terminal:
   the pulse-width modulator having a first complementary PWM output terminal, a second complementary PWM output terminal, and a select terminal for receiving the select signal, and wherein the pulse-width modulator outputs first and second complementary PWM signals having pulse widths determined by the select signal on the respective first and second complementary PWM output terminals;
   the power supply includes a first transistor and a second transistor, the first transistor having a first terminal connected to the first complementary PWM output terminal, a second terminal connected to the positive output terminal of the voltage source and a third terminal connected to ground, and the second transistor having a first terminal connected to the second complementary PWM output terminal, a second terminal connected to the negative output terminal of the voltage source, and a third terminal connected to ground; and further comprising:
   a first filtering device connected between the first power-supply output terminal of the power supply and the first power-supply input terminal of the amplifier; and a second filtering device connected between the second power-supply output terminal of the power supply and the second power-supply input terminal of the amplifier.

3. An apparatus comprising:
a pulse-width modulator which produces a PWM signal in response to an input signal;
a select circuit which has a first terminal connected to the pulse-width modulator, and a second terminal which receives a select signal from an external device;
a PWM output stage comprising:
an amplifier;
a PWM input terminal connected to the amplifier and the output node of the pulse-width modulator;
a PWM output terminal connected to the amplifier and a load and providing a PWM output signal to the load;
a first power-supply terminal connected to the amplifier and providing a first constant voltage;
a second power-supply terminal connected to the amplifier and providing a second constant voltage greater than the first constant voltage;
a third power-supply terminal connected to the amplifier and providing a third constant voltage; and
a selector which selects the first or second constant voltage in response to the select signal;
wherein the select circuit controls the PWM signal being provided to the amplifier in accordance with the constant voltage that the selector selects, and
wherein an amplitude of the PWM output signal is proportional to a voltage difference between the third constant voltage and the selected one of the first or second constant voltages.

4. The apparatus of claim 3, wherein the selector comprises a switch connected between the first and second power-supply terminals and the amplifier, wherein the switch has a terminal which receives the select signal from the external device, and wherein the switch is configured to select one of the first and second constant voltages in response to the select signal.

5. A method for amplifying an input signal, the method comprising:
generating a PWM signal from the input signal;
providing a select signal to select a voltage level for an amplitude of a PWM output signal which is different from the PWM signal; and
adjusting a pulse-width of the PWM output signal in accordance with the select signal to maintain a constant gain of the input signal regardless of a level of the input signal or the selected voltage level for the amplitude of the PWM output signal.

6. The method according to claim 5, further comprising:
providing a plurality of power supply terminals which respectively provide a plurality of voltage levels, wherein the select signal selects one of the plurality of voltage levels.

7. The method of claim 5, further comprising:
changing the voltage level to a lower voltage level from a higher voltage level; and
increasing the pulse-width of the PWM output signal.

8. The method of claim 5, wherein the PWM output signal is generated by amplifying the PWM signal by an amplifier which has a power-supply terminal which provides the voltage level, and the amplitude of the PWM output signal is proportional to the voltage level on the power supply terminal.

9. The method according to claim 5, wherein the voltage level is provided by a power supply, the power supply selecting the voltage level determined in accordance with the select signal.

10. The method according to claim 9, wherein the power supply comprises a variable-voltage power supply providing a variable power-supply voltage of a level selected by the select signal.

11. An apparatus comprising:
a pulse-width modulator which produces a PWM signal in response to an input signal;
a select circuit connected to the pulse-width modulator;
an amplifier connected to the pulse-width modulator, the amplifier receiving the PWM signal and producing a PWM output signal in response to the PWM signal received; and
a power-supply terminal connected to the amplifier,
wherein the select circuit controls the PWM signal being provided to the amplifier in accordance with a voltage level on the power-supply terminal, and
wherein the PWM output signal is proportional to the voltage level on the power-supply terminal.

12. The apparatus according to claim 11, wherein the power-supply terminal includes a plurality of power-supply terminals which respectively provide a plurality of voltage levels, and the select circuit controls the PWM signal in response to a select signal which selects one of the plurality of the power-supply terminals.

13. The apparatus according to claim 11, wherein the select circuit includes a plurality of output terminals, the select circuit receiving the PWM signal and providing the PWM signal on one of the plurality of output terminals.

14. The apparatus according to claim 13, further comprising a first switch and a second switch, each switch having a first input terminal and a second input terminal,
wherein the plurality of output terminals includes a first output terminal and a second output terminal, and
the power-supply terminal includes a first power-supply terminal which provides a first voltage level and a second power-supply terminal which provides a second voltage level, and
the first input terminal of the first switch is connected to the first output terminal and the second input terminal of the first switch is connected to the first power-supply terminal, and the first input terminal of the second switch is connected to the second output terminal and the second input terminal of the second switch is connected to the second power-supply terminal.

15. The apparatus according to claim 11, wherein the amplifier is an H-bridge amplifier.

16. The apparatus according to claim 11, where the amplifier is a half-bridge amplifier.

17. The apparatus according to claim 11, wherein the select circuit alters a pulse-width of the PWM signal.

18. The apparatus according to claim 17, wherein the select circuit changes the pulse-width of the PWM signal to maintain a constant gain for the PWM output signal.

19. The apparatus according to claim 17, wherein the select circuit increases the pulse-width of the PWM signal when the voltage level of the power-supply terminal changes to a lower level.

20. The apparatus according to claim 19, wherein the amplifier produces the PWM output signal having a gain proportional to a pulse-width of the PWM signal and the voltage level on the power-supply terminal, and wherein the pulse-width modulator changes the pulse-width of the PWM signal to maintain the gain for the selected amplitude of the PWM output signal.

21. The apparatus according to claim 11, further comprising a power supply connected to the power-supply terminal and having a select terminal which receives a select signal from an external device, wherein the power supply provides a first power-supply voltage having a level determined in accordance with the select signal.

22. The apparatus according to claim 21, wherein the power supply comprises a variable-voltage power supply providing a variable power-supply voltage of a level selected by the select signal.

23. The apparatus according to claim 21, further comprising a second power-supply terminal connected to the power supply and the amplifier, wherein the power supply provides at least one of the first power-supply voltage on the power-supply terminal and a second power-supply voltage on the second power-supply terminal, in accordance with the select signal, and wherein the PWM output signal has an amplitude proportional to at least one of the first and second power-supply voltages.

24. The apparatus according to claim 21, further comprising a plurality of power-supply terminals, wherein the power supply further comprises a plurality of power-supply output terminals connected to the plurality of power-supply terminals, the power supply provides at least one of a plurality of power-supply voltages on one of the plurality of power-supply output terminals in accordance with the select signal, and wherein the amplifier further comprises a plurality of power-supply input terminals connected to the plurality of power-supply terminals, wherein the PWM output signal has an amplitude proportional to at least one of the plurality of power-supply voltages.

25. An apparatus comprising:

a pulse-width modulating means for producing a PWM signal in response to an input signal;

a selecting circuit means connected to the pulse-width modulating means;

an amplifying means for receiving the PWM signal being received, the amplifying means connected to the pulse-width modulating means and producing a PWM output signal in response to the PWM signal received; and power-supply means connected to the amplifying means, wherein the selecting circuit means controls the PWM signal being provided to the amplifying means in accordance with a voltage level on the power-supply means, and wherein the PWM output signal is proportional to the voltage level on the power-supply means.

* * * * *